United States Patent
Shome et al.

(10) Patent No.: US 10,732,524 B2
(45) Date of Patent: Aug. 4, 2020

(54) OPTICAL SYSTEM OF AN ALIGNMENT SYSTEM

(71) Applicant: ASML Holding N.V., Veldhoven (NL)

(72) Inventors: Krishanu Shome, Cheshire, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 15/746,164

(22) PCT Filed: Jul. 19, 2016

(86) PCT No.: PCT/EP2016/067102
§ 371 (c)(1),
(2) Date: Jan. 19, 2018

(87) PCT Pub. No.: WO2017/021131
PCT Pub. Date: Feb. 9, 2017

(65) Prior Publication Data
US 2018/0224759 A1 Aug. 9, 2018

Related U.S. Application Data

(60) Provisional application No. 62/199,567, filed on Jul. 31, 2015.

(51) Int. Cl.
*G02B 5/30* (2006.01)
*G03F 9/00* (2006.01)
*G02B 27/09* (2006.01)

(52) U.S. Cl.
CPC ............. *G03F 9/7065* (2013.01); *G02B 5/30* (2013.01); *G02B 27/0977* (2013.01)

(58) Field of Classification Search
CPC .................................... G03F 9/70; G02B 5/30
See application file for complete search history.

(56) References Cited

U.S. PATENT DOCUMENTS 2,441,049 A    5/1948 West
5,053,628 A   10/1991 Yamamoto et al.
(Continued)

FOREIGN PATENT DOCUMENTS

CN    104570187 A  *  1/2015  ........... G02B 5/3083
EP      0266203 A2      5/1988
(Continued)

OTHER PUBLICATIONS

Hisao Kikuta "Achromatic quarter-wave plates using the dispersion of form birefringence", Applied Optics, vol. 36, No. 7, Mar. 1997.*
(Continued)

*Primary Examiner* — Maurice C Smith
(74) *Attorney, Agent, or Firm* — Sterne, Kessler, Goldstein & Fox P.L.L.C.

(57) ABSTRACT

An optical system for improving alignment measurement accuracy is discussed. The optical system includes first and second optical elements. The first optical element may be configured to change a first beam having a first polarization state into a second beam having a second polarization state. The second optical element may be configured to provide total internal reflection of the second beam and to change the second beam into a third beam having a third polarization state. The first, second, and third polarization states may be different from each other.

17 Claims, 5 Drawing Sheets

(56) References Cited

U.S. PATENT DOCUMENTS

| | | | |
|---|---|---|---|
| 5,847,872 A * | 12/1998 | Ito | G01J 4/00 359/489.06 |
| 6,318,862 B1 * | 11/2001 | Sarayeddine | G03B 21/10 348/767 |
| 7,110,623 B1 * | 9/2006 | Kalibjian | G02B 5/02 359/251 |
| 8,866,997 B2 * | 10/2014 | Pau | C09K 19/38 349/127 |
| 9,927,726 B2 | 3/2018 | Tinnemans et al. | |
| 2001/0052968 A1 * | 12/2001 | Shiozawa | G03F 7/70066 355/53 |
| 2002/0130815 A1 * | 9/2002 | Mehen | H01Q 1/28 343/700 MS |
| 2003/0048960 A1 | 3/2003 | Outsuka | |
| 2004/0165266 A1 * | 8/2004 | Galstian | G02B 27/286 359/487.02 |
| 2008/0049584 A1 * | 2/2008 | Tan | G02B 5/305 369/112.16 |
| 2012/0194824 A1 * | 8/2012 | de Groot | G01B 9/02003 356/482 |

FOREIGN PATENT DOCUMENTS

| | | | |
|---|---|---|---|
| EP | 0266203 | A3 | 12/1988 |
| EP | 0408381 | A2 | 1/1991 |
| EP | 0408381 | A3 | 7/1992 |
| EP | 1906252 | A1 | 4/2008 |
| JP | H03-232216 | A | 10/1991 |
| JP | H05-226222 | A | 9/1993 |
| JP | H05-226224 | A | 9/1993 |
| JP | H09-034011 | A | 2/1997 |
| JP | H10-141915 | A | 5/1998 |
| JP | 2000-003855 | A | 1/2000 |
| JP | 2003-324058 | A | 11/2003 |
| JP | 2007-264064 | A | 10/2007 |
| JP | 2008-192957 | A | 8/2008 |
| JP | 2016-539356 | A | 12/2016 |
| WO | WO 2015/051970 | A1 | 4/2015 |

OTHER PUBLICATIONS

M.J. Lazarus "The Fresnel Rhomb as a Millimeter-Wave Circular Polarizer", Microwave and Optical Technology Letters 1999 (Year: 1999).*

Vorlesung, Introduction to Quantum Physics, http://staff.mbi-berlin. de/hertel/physik3/chapter7/7.8html/01.htm Apr. 21, 2012 (Year: 2012).*

M. J. Lazarus and S. Petithomme, "The Fresnel Rhomb as a Millimeter-Wave Circular Polarizer" Sep. 3, 1998 (Year: 1998).*

International Search Report and Written Opinion of the International Searching Authority directed to related International Patent Application No. PCT/EP2016/067102, dated Nov. 3, 2016; 11 pages.

International Preliminary Report on Patentability directed to related International Patent Application No. PCT/EP2016/067102, dated Feb. 6, 2018; 6 pages.

* cited by examiner

OPTICAL SYSTEM OF AN ALIGNMENT SYSTEM

CROSS-REFERENCE TO RELATED APPLICATIONS

This application claims priority of U.S. Provisional Patent Application No. 62/199,567, which was filed on Jul. 31, 2015, and which is incorporated herein in its entirety by reference.

FIELD

The present disclosure relates to an alignment system that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks, which may comprise diffraction gratings are placed on the substrate to be aligned and are located with reference to a second object. Lithographic apparatus may use an alignment system for detecting positions of the alignment marks and for aligning the substrate using the alignment marks to ensure accurate exposure from a mask.

Alignment systems typically have their own illumination system that may be used to illuminate the alignment marks during alignment measurements. The radiation diffracted from the illuminated alignment marks may be detected and used to determine the positions of the alignment marks. The accuracy and characteristics of diffraction signals detected from the illuminated alignment marks may be dependent on the polarization state of the radiation beam used to illuminate the alignment marks. This dependency is due to the diffraction efficiency of the alignment marks being related to the polarization state of the radiation beam.

The radiation beam may have linear, circular, or elliptical polarization states. Each polarization state can be characterized by two orthogonal polarization states. For example, linear polarization state can be characterized by horizontal and vertical polarization states, and circular polarization can be characterized by right- and left-handed polarization states. A horizontally or vertically polarized radiation beam may be used for alignment marks composed of either vertical or horizontal lines. The polarization can be parallel or perpendicular to the vertical or horizontal lines. A circularly polarized radiation beam may be useful for alignment marks having lines or gratings of both horizontal and vertical orientations or having gratings with unknown orientations. A circularly polarized radiation beam can be considered to have two perpendicular polarized components of equal amplitude that are either +90° or −90° out of phase with respect to each other and can be characterized as right- and left-handed polarization states based on the rotation of its components. Either or both of the two circular polarization states may be used for alignment measurements.

To provide circularly polarized radiation beams for alignment measurements, some of the current alignment systems use, for example, quarter wave plates to convert linearly polarized radiation beams from the illuminations system into circularly polarized radiation beams. These circularly polarized radiation beams are then directed onto the alignment marks using fold mirrors. In some alignment systems, the fold mirror may contain a metallic layer. A disadvantage of using such fold mirrors is that at least a portion of the radiation beam is absorbed by the fold mirrors, while being directed onto the alignment marks. Such loss of radiation through absorption may cause, for example, reduction in diffraction efficiency of the alignment marks and reduction in diffraction signal intensity detected from the alignment marks. Another disadvantage is that the fold mirrors become heated during operation due to the absorption of at least a portion of the radiation beam. Such heating of the fold mirrors may cause, for example, a wavefront error in the radiation beam reflected from the alignment marks, which may result in inaccurate alignment measurements of the alignment system.

SUMMARY

Accordingly, there is a need for improving accuracy of alignment measurements in an alignment system.

According to an embodiment, an optical system includes first and second optical elements. The first optical element may be configured to change a first beam having a first polarization state into a second beam having a second polarization state. The second optical element may be configured to provide total internal reflection of the second beam and to convert the second beam into a third beam having a third polarization state. The first, second, and third polarization states may be different from each other.

In another embodiment, an alignment system includes an illumination system and an optical system. The illumination system may be configured to provide a first beam having a first polarization state. The optical system includes first and second optical elements. The first optical element may be configured to change the first beam into a second beam having a second polarization state. The second optical element may be configured to provide total internal reflection of the second beam and to change the second beam into a third beam having a third polarization state. The first, second, and third polarization states may be different from each other.

Yet in another embodiment, a lithographic apparatus includes an illumination system, a projection system, and an alignment system. The illumination system may be configured to illuminate a pattern of a patterning device and the projection system may be configured to project an image of the pattern on to a target portion of a substrate. The alignment system includes first and second optical elements. The first optical element may be configured to change a first beam having a first polarization state into a second beam having a second polarization state. The second optical element may be configured to provide total internal reflection of the second beam and to change the second beam into a third beam having a third polarization state. The first, second, and third polarization states may be different from each other.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
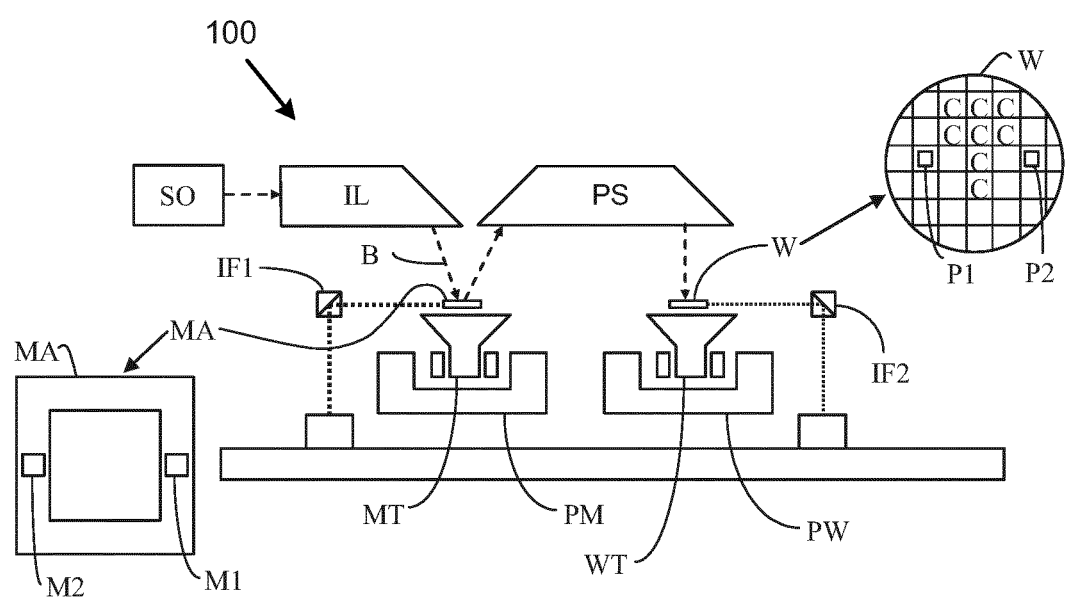
FIG. 1A is a schematic illustration of a reflective lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1B:
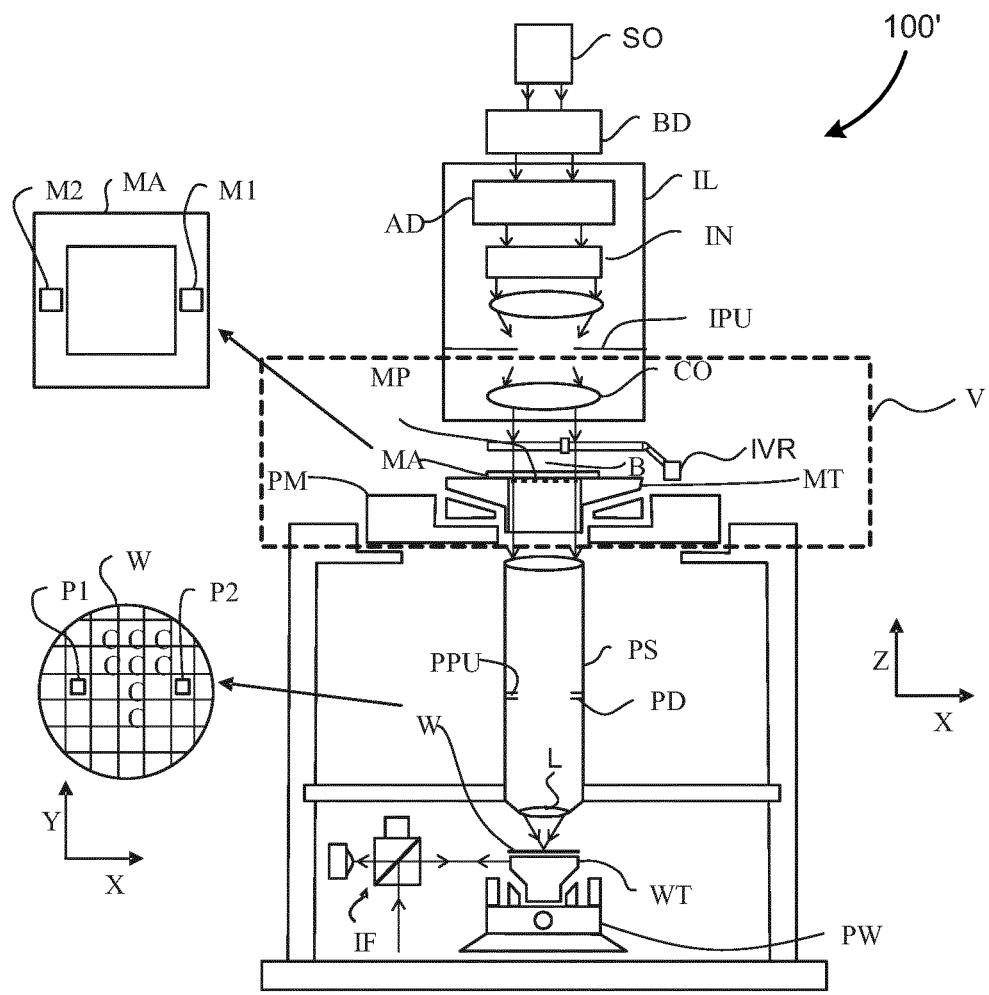
FIG. 1B is a schematic illustration of a transmissive lithographic apparatus according to an embodiment of the invention.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
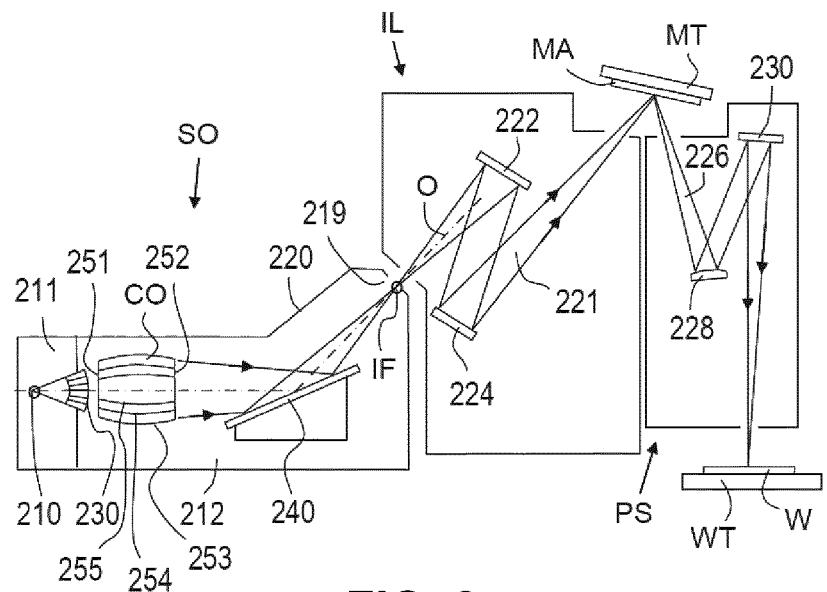
FIG. 2 is a more detailed schematic illustration of the reflective lithographic apparatus, according to an embodiment of the invention.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
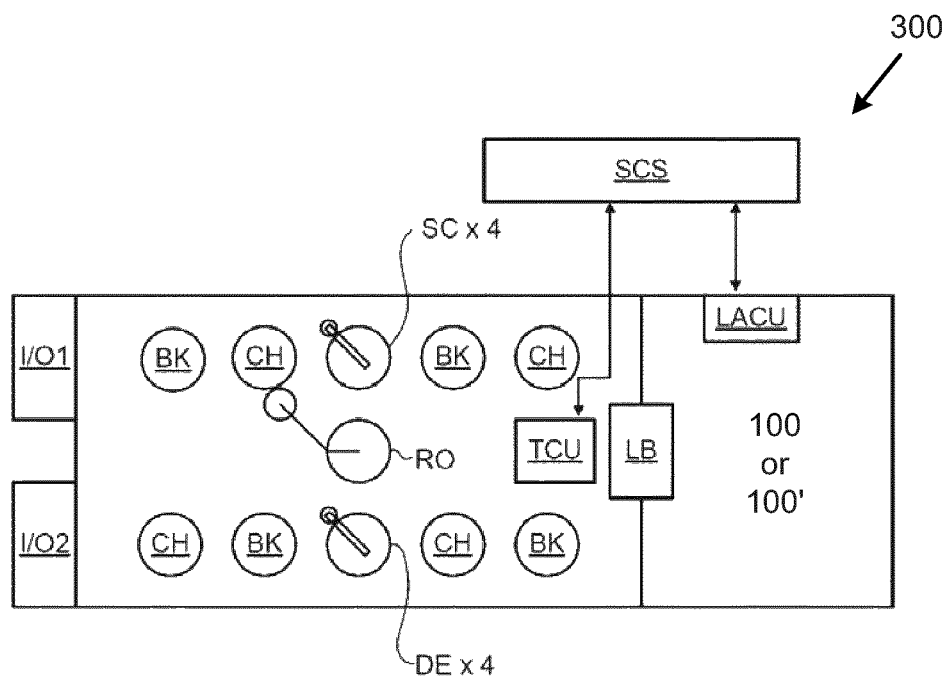
FIG. 3 is a schematic illustration of a lithographic cell, according to an embodiment of the invention.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Alignment System According to an Embodiment

Figure 4:
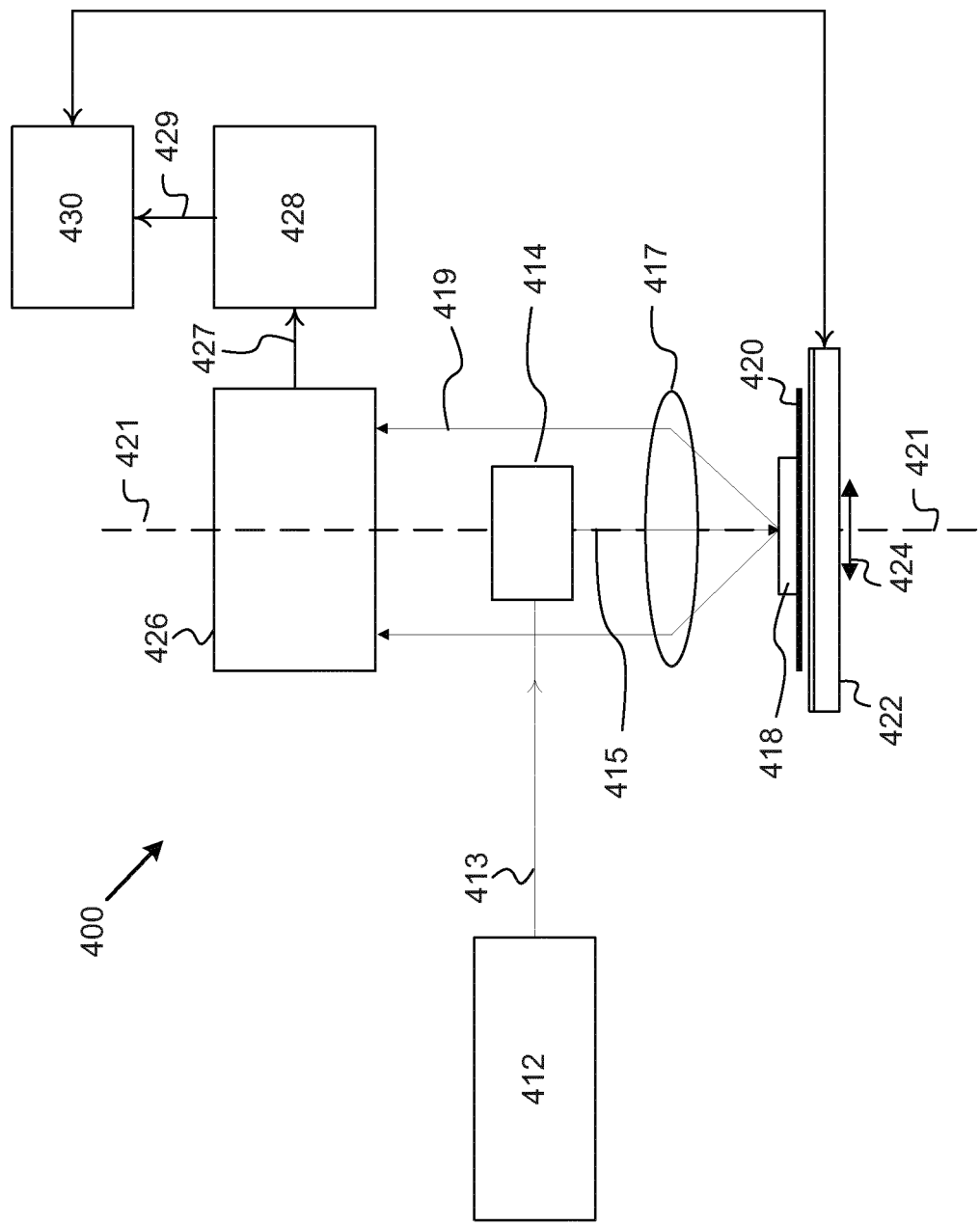
FIG. 4 is a schematic illustration of an alignment system, according to an embodiment of the invention.

FIG. 4 illustrates a schematic of a cross-sectional view of an alignment system 400 that can be implemented as a part of lithographic apparatus 100 or 100', according to an embodiment. In an example of this embodiment, alignment system 400 may be configured to align a substrate (e.g., substrate W) with respect to a patterning device (e.g., patterning device MA). Alignment system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, alignment system 400 may include an illumination system 412, an optical system 414, an objective system 417, an image rotation interferometer 426, a detector 428, and a signal analyzer 430. Illumination system 412 may be configured to provide an electromagnetic narrow band radiation beam 413 having a first polarization state, such as a linear polarization state. In an example, the narrow band radiation beam 413 may be within a spectrum of wavelengths between about 500 nm to about 900 nm. In another example, the narrow band radiation beam 413 comprises discrete narrow passbands within a spectrum of wavelengths between about 500 nm to about 900 nm. Yet in another example, radiation beam 413 may be monochromatic, for example, provided by a monochromatic light source, such as a laser light source in illumination system 412. But polychromatic light sources such as LEDs may also be used in illumination system 412 to provide a polychromatic radiation beam 413.

Optical system 414 may be configured to receive radiation beam 413 having a first polarization state and convert it into a radiation beam 415 having a second polarization, such as a circularly polarization state, according an embodiment. In an example of this embodiment, optical system may be further configured to direct radiation beam 415 onto a substrate 420, as shown in FIG. 4, without causing the problems discussed above with respect to current alignment systems. That is, optical system 414 may be configured to direct radiation beam 415 without absorbing any substantial portion of it and without any substantial heating of elements of optical system 414.

Substrate 420 may be placed on a stage 422 moveable along direction 424. Radiation beam 415 may be configured to illuminate an alignment mark 418 located on substrate 420. Alignment mark 418 may be coated with a radiation sensitive film in an example of this embodiment. In another example, alignment mark 418 may have one hundred and eighty degree symmetry. That is, when alignment mark 418 is rotated one hundred and eighty degrees about an axis of symmetry perpendicular to a plane of alignment mark 418, rotated alignment mark 418 may be substantially identical to an unrotated alignment mark 418.

As illustrated in FIG. 4, objective system 417 may be configured to direct diffracted radiation beam 417 towards image rotation interferometer 426, according to an embodiment. Objective system 417 may comprise any appropriate number of optical elements suitable for directing diffracted radiation beam 419. In an example embodiment, diffracted radiation beam 419 may be at least a portion of radiation beam 415 that is diffracted from alignment mark 418. It should be noted that even though diffracted radiation beam 419 has been shown to pass outside optical system 414 in FIG. 4, the disclosure in not so limiting. Optical system 414 may be substantially transparent to diffracted radiation beam 419 and may allow diffracted radiation beam 419 to pass through it without substantially changing the properties of diffracted radiation beam 419. It should be further noted that even though objective system 417 is shown to direct radiation beam 419 towards image rotation interferometer 426, the disclosure is not so limiting. It would be apparent to a person skilled in the relevant art that other optical arrangements may be used to obtain the similar result of detecting diffraction signals from alignment mark 418.

In a further embodiment, image rotation interferometer 426 may comprise any appropriate set of optical-elements, for example, a combination of prisms that may be configured to form two images of alignment mark 418 based on the received diffracted radiation beam 419. It should be appreciated that a good quality image need not be formed, but that the features of alignment mark 418 should be resolved. Image rotation interferometer 426 may be further configured to rotate one of the two images with respect to the other of the two images one hundred and eighty degrees and recombine the rotated and unrotated images interferometrically.

Detector 428 may be configured to receive the recombined image and detect an interference as a result of the recombined image when alignment axis 421 of alignment system 400 passes through a center of symmetry (not shown) of alignment mark 418. Such interference may be due to alignment mark 418 being one hundred and eighty degree symmetrical, and the recombined image interfering constructively or destructively, according to an example embodiment. Based on the detected interference, detector 428 may be further configured to determine a position of the center of symmetry of alignment mark 418 and consequently, detect a position of substrate 420. According to an example, alignment axis 421 may be aligned with an optical beam perpendicular to substrate 420 and passing through a center of image rotation interferometer 426.

In a further embodiment, signal analyzer 430 may be configured to receive signal 429 including information of the determined center of symmetry. Signal analyzer 430 may be further configured to determine a position of stage 422 and correlate the position of stage 422 with the position of the center of symmetry of alignment mark 418. As such, the position of alignment mark 418 and consequently, the position of substrate 420 may be accurately known with reference to stage 422. Alternatively, signal analyser 430 may be configured to determine a position of alignment system 400 or any other reference element such that the center of symmetry of alignment mark 418 may be known with reference to alignment system 400 or any other reference element.

Optical System According to an Embodiment

Figure 5:
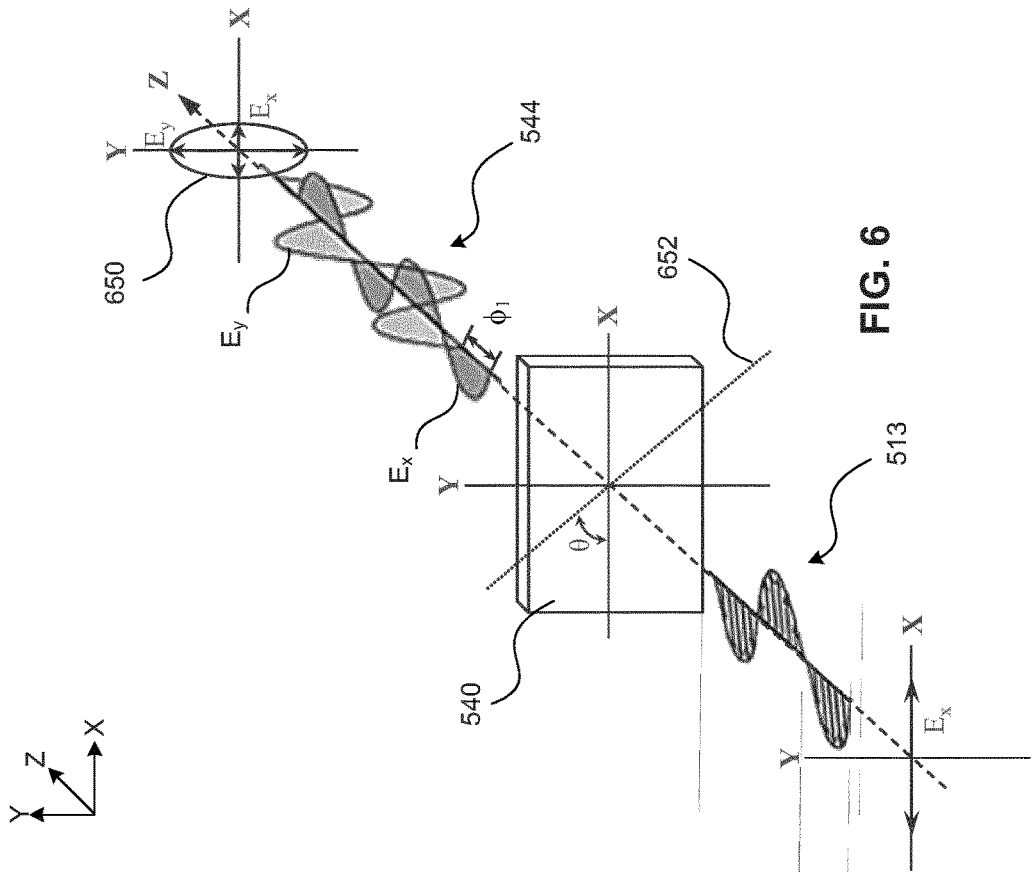
FIG. 5 is a schematic illustration of an optical system of an alignment system, according to an embodiment of the invention.

FIG. 5 illustrates a schematic of a cross-sectional view of an optical system 514, according to an embodiment. Optical system 514 may represent an example embodiment of optical system 414 shown in FIG. 4. Radiation beams 513 and 515 may be similar to radiation beams 413 and 415 discussed above with respect to FIG. 4.

In an example of this embodiment, optical system 514 may comprise a wave plate 540 and an optical element 542. Wave plate 540 may comprise one or more wave plates having birefringent materials such as, but not limited to, quartz, magnesium, and sapphire. For example, wave plate 540 may include a pair of a quartz wave plate and a magnesium fluoride wave plate or a pair of a quartz wave plate and a sapphire wave plate. These pairs of wave plates or any other combination of wave plates constituting wave plate 540 may be cemented, mounted with an air gap, optically contacted, or optically coupled to each other.

Figure 6:
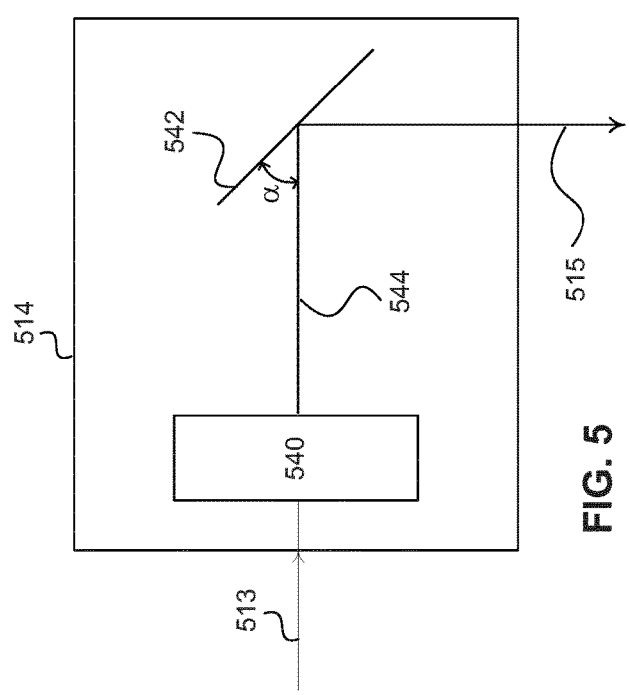
FIG. 6 is a schematic illustration of polarization states of a radiation beam propagating through a wave plate, according to an embodiment of the invention.

Wave plate 540 may be configured to provide a desired achromatic or higher order wavelength correction to a radiation beam (e.g., radiation beam 513) passing through it based on the orientation of wave plate 540 and the type of birefringent material(s) constituting wave plate 540. Wave plate 540 may be further configured to convert a radiation beam having a first polarization state into a radiation beam having a second polarization state. For example, as illustrated in FIG. 5, wave plate 540 is configured to receive an input radiation beam 513 having a first polarization state and to convert radiation beam 513 into a radiation beam 544 having a second polarization state. The first polarization state may be a linear polarization state and the second polarization state may be an elliptical polarization state, as illustrated in FIG. 6. The birefringence property of the birefringent material(s) of wave plate 540 may help in this conversion between the first and second polarization states. Birefringent material typically has a refractive index value that is dependent on orientation of light passing through it. Polarized light propagating through such material may experience a different refractive index value for different directions of propagation and polarization orientations. Such phenomenon may be referred as birefringence. However, polarized light propagating along optical axis of birefringent material may encounter only one refractive index value regardless of its polarization direction.

FIG. 6 schematically illustrates the conversion of radiation beam 513 into radiation beam 544 after passing through wave plate 540. Radiation beam 513 comprises a linearly polarized electromagnetic wave propagating along Z-axis with its electric field component $E_x$ oscillating along X-axis, as shown in FIG. 6, in an example of this embodiment. Due to birefringence effect in wave plate 540, linearly polarized radiation beam 513 may be converted into two linearly polarized orthogonal components, e.g., electric field component ($E_x$) oriented along ordinary axis (e.g., X-axis) of wave plate 540 and electric field component ($E_y$) oriented along extraordinary axis (e.g., Y-axis) of wave plate 540 when travelling through wave plate 540. The travelling speed of each of these components may be different with respect to each other within wave plate 540 due to the birefringence effect. This difference in speed between the two orthogonal components while travelling through wave plate 540 may introduce a relative phase shift between them, and may result in radiation beam 544 having a first phase value of $\varphi_1$ and the second polarization state that is different from the first polarization state of radiation beam 513. As illustrated in FIG. 6, radiation beam 544 may have an elliptical polarization state when radiation beam 544 has a first phase value of $\varphi_1$ that is greater or less than about ±90° and when the electric field components, $E_x$ and $E_y$, of radiation beam 544 trace out an ellipse 650 on XY plane over a complete wave cycle as radiation beam 544 propagates along Z-axis. Radiation beam 544 may be considered to be completely polarized.

The ellipticity and phase shift introduced by wave plate 540 may be dependent on orientation of wave plate 540 with respect to the incident plane (e.g., XZ plane) of radiation beam 513. In an example, for conversion of linearly polarized radiation beam 513 into elliptically polarized radiation beam 544, optical axis 652 of wave plate 540 may be oriented at an angle θ with respect to the XZ plane, where angle θ is greater or less than about 45°. The phase shift may also be dependent on thickness of wave plate 540 and variation of refractive index values in it. By appropriate choice of the relationship between these parameters, it may be possible to control the magnitude and orientation of the ellipse of the elliptical polarization state.

Figure 7:
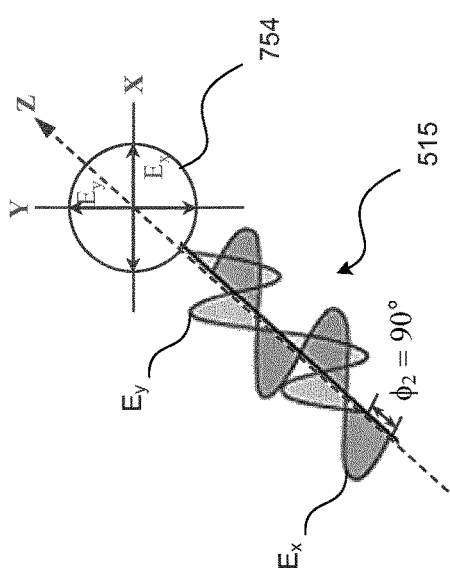
FIG. 7 is a schematic illustration of a polarization state of a radiation beam, according to an embodiment of the invention.

Referring back to FIG. 5, optical element 542 may be configured to be oriented at an angle α with respect to propagation direction of radiation beam 544 and to receive radiation beam 544 from wave plate 540, in an embodiment. Optical element 542 may be further configured to provide total internal reflection of radiation beam 544, according to an embodiment. Such total internal reflection of radiation beam 544 may help to prevent or minimize absorption of radiation beam 544 by optical element 542 and hence, prevent or minimize heating of optical element 542. Total internal reflection may introduce a phase shift to the orthogonal components of radiation beam 544, and result in output radiation beam 515 having a second phase value of $\varphi_2$ and a third polarization state that may be different from the first and second polarization states. The third polarization state may be a circular polarization state (as illustrated in FIG. 7). Radiation beam 515 may have a right- or left-handed circular polarization state when radiation beam 515 has a second phase value of $\varphi_2$ that is equal to about ±90° and when the electric field components, $E_x$ and $E_y$, of radiation beam 515 trace out a circle 754 on an XY plane over a complete wave cycle as radiation beam 515 propagates along Z-axis (as shown in FIG. 7).

According to an embodiment, optical element 542 may be an element having a reflective surface (e.g., a total internal reflection fold mirror) and may comprise a glass material (e.g., SF2 glass manufactured by SCHOTT). The phase shift introduced to radiation beam 544 may be dependent on refractive index value of optical element 542 and/or the orientation (angle α) of optical element 542 with radiation beam 544. The selection of birefringent materials and the thickness and orientation for wave plate 540 may be made based on this refractive index value of optical element 542 to achieve a desired polarization state of radiation beam 515. According to an example, in order to achieve the desired circular polarization state of radiation beam 515 for optical element 542 having a refractive index value of 1.635 and acting as a total internal reflection fold mirror, wave plate 540 may be designed to have a pair of birefringent material wave plates (e.g., quartz wave plate having a thickness of about 664.8 μm and magnesium fluoride wave plate having a thickness of about 531.5 μm) and may be oriented at an angle θ of about 64.5°, about 115.5°, about 244.5°, or about 295.5° to introduce a phase shift value of about 130.9° to radiation beam 544. It should be noted that even though one example of birefringent material wave plates for wave plate 540 is discussed here, the disclosure is not so limiting. Other birefringent material wave plate or combinations of birefringent material wave plates may be selected for wave plate 540 for the same or different refractive index and orientation of optical element 542 to achieve the desired circular polarization state of radiation beam 515.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

The term "in substantial contact" as used herein generally describes elements or structures that are in physical contact with each other with only a slight separation from each other which typically results from misalignment tolerances. It should be understood that relative spatial descriptions between one or more particular features, structures, or characteristics (e.g., "vertically aligned," "substantial contact," etc.) used herein are for purposes of illustration only, and that practical implementations of the structures described herein may include misalignment tolerances without departing from the spirit and scope of the present disclosure.

The term "optically coupled" as used herein generally refers to one coupled element being configured to impart light to another coupled element directly or indirectly.

The term "optical material" as used herein generally refers to a material that allows light or optical energy to propagate therein or therethrough.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. An optical system comprising:
   a first optical element configured to change a first beam having a first polarization state into a second beam having a second polarization state; and
   a second optical element configured to:
   provide total internal reflection of the second beam; and
   change the second beam into a third beam having a third polarization state, wherein: the first, second, and third polarization states are different from each other, the first polarization state is a linear polarization state, the third polarization state is a circular polarization state, and the first and second optical elements are separated components and positioned a distance away from each other.

2. The optical system of claim 1, wherein the second polarization state is an elliptical polarization state.

3. The optical system of claim 1, wherein the first optical element is an achromatic wave plate.

4. The optical system of claim 1, wherein the first optical element comprises a birefringent wave plate.

5. The optical system of claim 1, wherein the second optical element comprises a reflective surface.

6. The optical system of claim 1, wherein the second optical element is a total internal reflection mirror.

7. The optical system of claim 1, wherein the first beam comprises a radiation beam in a spectrum of wavelengths between about 500 nm to 900 nm.

8. An alignment system comprising:
an illumination system configured to provide a first beam having a first polarization state; and
an optical system comprising:
a first optical element configured to change the first beam into a second beam having a second polarization state; and
a second optical element configured to:
provide total internal reflection of the second beam; and
change the second beam into a third beam having a third polarization state,
wherein: the first, second, and third polarization states are different from each other, the first polarization state is a linear polarization state, the third polarization state is a circular polarization state, and the first and second optical elements are separated components and positioned a distance away from each other.

9. The alignment system of claim 8, wherein the second polarization state is an elliptical polarization state.

10. The alignment system of claim 8, wherein the first optical element comprises a birefringent wave plate.

11. The alignment system of claim 8, wherein the second optical element comprises a reflective surface.

12. A lithographic apparatus comprising:
an illumination system configured to illuminate a pattern of a patterning device;
a projection system configured to project an image of the pattern on to a target portion of a substrate; and
an alignment system configured to align the substrate with respect to the patterning device, the alignment system comprising:
a first optical element configured to change a first beam having a first polarization state into a second beam having a second polarization state; and
a second optical element configured to:
provide total internal reflection to the second beam; and
change the second beam into a third beam having a third polarization state,
wherein the first, second, and third polarization states are different from each other.

13. The lithographic apparatus of claim 12, wherein the first polarization state is a linear polarization state.

14. The lithographic apparatus of claim 12, wherein the second polarization state is an elliptical polarization state.

15. The lithographic apparatus of claim 12, wherein the third polarization state is a circular polarization state.

16. The lithographic apparatus of claim 12, wherein the first optical element comprises a birefringent wave plate.

17. The lithographic apparatus of claim 12, wherein the second optical element comprises a reflective surface.

* * * * *